(12) United States Patent
Matsui et al.

(10) Patent No.: US 9,209,010 B2
(45) Date of Patent: Dec. 8, 2015

(54) SUBSTRATE CLEANING METHOD AND SUBSTRATE CLEANING DEVICE

(75) Inventors: Hidefumi Matsui, Nirasaki (JP); Tsuyoshi Moriya, Tokyo (JP); Masaki Narushima, Nirasaki (JP)

(73) Assignees: TOKYO ELECTRON LIMITED, Tokyo (JP); IWATANI CORPORATION, Osaka-shi (JP)

( * ) Notice: Subject to any disclaimer, the term of this patent is extended or adjusted under 35 U.S.C. 154(b) by 678 days.

(21) Appl. No.: 13/579,772

(22) PCT Filed: Feb. 3, 2011

(86) PCT No.: PCT/JP2011/052797
§ 371 (c)(1),
(2), (4) Date: Oct. 26, 2012

(87) PCT Pub. No.: WO2011/102279
PCT Pub. Date: Aug. 25, 2011

(65) Prior Publication Data
US 2013/0056033 A1    Mar. 7, 2013

(30) Foreign Application Priority Data
Feb. 19, 2010    (JP) .................................. 2010-035053

(51) Int. Cl.
*B08B 5/02*    (2006.01)
*B08B 7/00*    (2006.01)
*H01L 21/02*    (2006.01)
*H01L 21/67*    (2006.01)

(52) U.S. Cl.
CPC ............ *H01L 21/02057* (2013.01); *B08B 5/02* (2013.01); *H01L 21/02046* (2013.01); *H01L 21/67028* (2013.01)

(58) Field of Classification Search
CPC ................... H01L 21/02057; H01L 21/02046; H01L 21/67028; B08B 5/02
See application file for complete search history.

(56) References Cited

U.S. PATENT DOCUMENTS

| | | |
|---|---|---|
| 5,089,441 A | 2/1992 | Moslehi |
| 5,512,106 A | 4/1996 | Tamai et al. |
| 5,796,111 A | 8/1998 | Mahoney |
| 6,449,873 B1 * | 9/2002 | Yoon et al. ...................... 34/448 |
| 2004/0094508 A1* | 5/2004 | Nakasaki ........................ 216/63 |
| 2011/0147896 A1 | 6/2011 | Koike et al. |
| 2014/0061031 A1* | 3/2014 | Yoshino et al. .......... 204/192.32 |

FOREIGN PATENT DOCUMENTS

| | | |
|---|---|---|
| CN | 102124544 A | 7/2011 |
| JP | 6 145969 | 5/1994 |

(Continued)

OTHER PUBLICATIONS

International Search Report issued Apr. 5, 2011 in PCT/JP11/052797 Filed Feb. 3, 2011.

*Primary Examiner* — Alexander Markoff
(74) *Attorney, Agent, or Firm* — Oblon, McClelland, Maier & Neustadt, L.L.P.

(57) ABSTRACT

A substrate cleaning method includes removing a foreign material attached to a substrate while preventing deterioration of the substrate and any film formed on or above the substrate. A cleaning gas at a pressure between 0.3 MPa and 2.0 MPa is sprayed towards a wafer W with attached foreign material 22 placed in a near-vacuum, producing clusters 21 made up of a multitude of gas molecules 20, and the clusters 21 collide with the wafer W without undergoing ionization.

24 Claims, 4 Drawing Sheets

(56) References Cited

FOREIGN PATENT DOCUMENTS

| | | |
|---|---|---|
| JP | 8-107144 | 4/1996 |
| JP | 11-330033 | 11/1999 |
| JP | 2001-137797 | 5/2001 |
| JP | 2003 218028 | 7/2003 |
| JP | 2009 29691 | 2/2009 |
| JP | 2009-43975 | 2/2009 |
| WO | 2010 021265 | 2/2010 |

* cited by examiner

SUBSTRATE CLEANING METHOD AND SUBSTRATE CLEANING DEVICE

FIELD OF THE INVENTION

The present invention relates to a substrate cleaning method and a substrate cleaning device, and more particularly to a substrate cleaning method and a substrate cleaning device for cleaning a substrate without the use of liquid.

BACKGROUND OF THE INVENTION

In case of manufacturing electronic devices on a substrate, e.g., a wafer through a plurality of steps, a desired pattern including, e.g., trenches or holes is formed on the wafer by performing a film formation process or etching process on the wafer in each step. At this time, a reaction product or unintended foreign substance may be generated in the film formation process or etching process and attached onto the wafer. Since the foreign materials or the like on the wafer adversely affects the processing of the next step, it is necessary to remove it as much as possible.

Conventionally, as a method of removing a foreign material on the wafer, a method of washing the foreign material by immersing the wafer in a chemical tank, or a method of washing the foreign material by spraying pure water or liquid chemical to the wafer has been used. In these methods, since the pure water or liquid chemical remains on the wafer after cleaning of the wafer, the wafer is dried by spin drying or the like.

However, during drying of the wafer, as shown in FIG. 4A, for example, if a liquid chemical 43 remains in trenches 41 and 42, a gas-liquid interfacial tension F is generated at the surface of the liquid chemical 43, and the gas-liquid interfacial tension F acts on convex portions 44a to 44c of the pattern. Thus, as shown in FIG. 4B, the convex portion 44a or 44c of the pattern may collapse.

In order to prevent the collapse of the convex portion of the pattern, a dry cleaning method for cleaning the wafer without the use of pure water and liquid chemical is suitable. As a dry cleaning method, a method of evaporating the foreign material by irradiating a laser beam on the wafer, or a method of physically removing the foreign material by sputtering using a plasma has been known. However, when the laser beam is irradiated on the wafer, the film formed on the wafer may be altered. Further, since the plasma has high energy, not only the foreign material but also the pattern may be cut by sputtering.

Therefore, recently, as a dry cleaning method in which the energy applied to the wafer is not very high, a method of using a gas cluster ion beam (GCIB) has been developed (see, e.g., Patent document 1). The GCIB is a method of forming a cluster of gas molecules by spraying a gas toward the vacuum atmosphere, ionizing the cluster, and allowing the ionized cluster to collide with the wafer by applying a bias voltage to the wafer. The cluster which has collided with the wafer is decomposed into gas molecules to scatter after granting the kinetic energy to the wafer. In this case, the kinetic energy promotes a chemical reaction between the foreign material and gas molecules on the wafer to generate a reaction product. Then, the reaction product is sublimated, thereby removing the foreign material.

PRIOR ART DOCUMENT

Patent document 1: Japanese Patent Application Publication No. 2009-29691

However, in the GCIB, since the ionized cluster is accelerated by the bias voltage to collide with the wafer, the gas molecules in the cluster may cause a defect in the wafer or the film formed on the wafer, or a predetermined amount of gas molecules may be doped to deteriorate the film or wafer.

SUMMARY OF THE INVENTION

The present invention provides a substrate cleaning method and substrate cleaning device capable of removing a foreign material attached to a substrate while preventing deterioration of the substrate or a film formed on the substrate.

In accordance with one aspect of the present invention, there is provided a substrate cleaning method including: forming a cluster including gas molecules by spraying, toward a substrate to which a foreign material is attached and which is disposed in a low pressure atmosphere, a high pressure gas having a pressure higher than that of the low pressure atmosphere; and allowing the cluster to collide with the substrate without being ionized.

Preferably, the foreign material removed from the substrate which the cluster has reached may be captured by a cooling unit disposed in a location different from the substrate.

Preferably, the high pressure gas may be obliquely sprayed to the substrate.

Preferably, the foreign material may be a natural oxide film, and the gas is a chlorine trifluoride gas.

Preferably, the foreign material may be organic matter, and the gas is a carbon dioxide gas.

Preferably, the foreign material may be metal, and the gas may be a hydrogen halide gas.

Preferably, when the cluster collides with the substrate, the substrate may be heated.

Preferably, the pressure when the gas is sprayed may range from 0.3 MPa to 2.0 MPa.

In accordance with one aspect of the present invention, there is provided a substrate cleaning device including: a processing chamber for accommodating a substrate to which a foreign material is attached in a low pressure atmosphere is formed; and a gas spraying unit for spraying, toward the substrate, a high pressure gas having a pressure higher than that of the low pressure atmosphere to form a cluster including gas molecules and allowing the cluster to collide with the substrate without being ionized.

Preferably, the substrate cleaning device may further include a cooling unit having a temperature lower than that of the substrate to capture the foreign material removed from the substrate which the cluster has reached, wherein the cooling unit is disposed in a location different from the substrate.

Preferably, the gas spraying unit may move along a surface of the substrate while spraying the high pressure gas.

Preferably, the gas spraying unit may obliquely spray the high pressure gas to the substrate.

Preferably, the substrate cleaning device may further include a heating unit which heats the substrate.

Preferably, the substrate cleaning device may further include an ejection unit which ejects another cluster having $CO_2$ blast or gas molecules toward the cooling unit.

Preferably, the gas spraying unit may spray the high pressure gas from a hole having a diameter of 0.02 mm to 1.0 mm.

Preferably, the high pressure gas may be sprayed to the substrate in multiple directions.

Preferably, the pressure and/or a spraying timing of the high pressure gas being sprayed in each of the multiple directions may be set differently.

Preferably, the gas spraying unit may be provided in a plural number to spray the high pressure gas toward the substrate in multiple directions.

Preferably, the pressure of the high pressure gas being sprayed in each of the multiple directions by the gas spraying units may be set differently, and/or the gas spraying units may spray the high pressure gas at different spraying timings.

In accordance with the present invention, the cluster including the gas molecules without being ionized collides with the substrate to which the foreign material is attached. Since the non-ionized cluster is never accelerated by a bias voltage or the like, each of the gas molecules scattering after the decomposition of the cluster is not doped in the substrate or the film formed on the substrate. On the other hand, since the cluster has a large mass even if it is not accelerated, it can grant to the substrate the kinetic energy greater than the kinetic energy which one gas molecule grants to the substrate at the time of collision, thereby promoting a chemical reaction between the foreign material and the gas molecules. Therefore, it is possible to remove the foreign material attached to the substrate while preventing deterioration of the substrate or the film formed on the substrate.

In accordance with the present invention, the scattering foreign material removed from the substrate is attracted and captured to the cooling unit (particle collection unit) set to a low temperature by a thermophoretic force. Thus, it is possible to prevent the reaction product removed from the substrate from reaching the substrate and being attached to the substrate again.

In accordance with the present invention, the high pressure gas is obliquely sprayed to the substrate. When the cluster collides with the substrate, a reflection wave occurs from the substrate. However, since the cluster obliquely collides with the substrate, the reflection wave is generated in a direction different from a moving direction of the cluster. Thus, the reflection wave does not collide head-on with other clusters, and the other clusters are not decomposed. Therefore, it is possible to continue the collision between the cluster and the substrate and prevent a reduction in efficiency of removing the foreign material from the substrate.

In accordance with the present invention, the foreign material is a natural oxide film, and the gas is a chlorine trifluoride gas. The natural oxide film causes a chemical reaction with chlorine trifluoride to generate the reaction product. Accordingly, it is possible to surely remove the natural oxide film serving as the foreign material from the substrate.

In accordance with the present invention, the foreign material is organic matter, and the gas is a carbon dioxide gas. The organic matter causes a chemical reaction with carbon dioxide to generate the reaction product. Accordingly, it is possible to surely remove the organic matter serving as the foreign material from the substrate.

In accordance with the present invention, the foreign material is metal, and the gas is a hydrogen halide gas. The metal causes a chemical reaction with hydrogen halide to generate the reaction product. Accordingly, it is possible to surely remove the metal serving as the foreign material from the substrate.

In accordance with the present invention, when the cluster collides with the substrate, the substrate is heated. When the substrate is heated, a chemical reaction between the foreign material and the gas molecules is promoted. Accordingly, it is possible to surely remove the foreign material from the substrate.

In accordance with the present invention, since the pressure when the cleaning gas is sprayed ranges from 0.3 MPa to 2.0 MPa, when the gas is sprayed, it causes a rapid adiabatic expansion in the low pressure atmosphere so that the gas molecules are cooled rapidly. As a result, it is possible to promote the formation of the cluster.

In accordance with the present invention, since the gas spraying unit moves along the surface of the substrate while spraying the high pressure gas, it is possible to remove the foreign material from the entire surface of the substrate.

In accordance with the present invention, another cluster including $CO_2$ blast or gas molecules is ejected toward the cooling unit, and the foreign material captured by the cooling unit is detached from the cooling unit. Accordingly, it is possible to prevent a large amount of the reaction product from being attached to the cooling unit, thereby preventing a reduction in efficiency of collection of the foreign material removed from the substrate by the cooling unit.

In accordance with the present invention, since the gas spraying unit sprays the gas from the hole having a diameter of 0.02 mm to 1.0 mm, it is possible to increase an expansion rate of the gas when it is sprayed, and it is possible to further promote the formation of the cluster.

In accordance with the present invention, since the high pressure gas is sprayed to the substrate in the multiple directions, it is possible to prevent the collision of the cluster from failing to occur in some places in the substrate.

In accordance with the present invention, the pressure of the high pressure gas being sprayed in each of the multiple directions is set differently, and/or a spraying timing of the high pressure gas is set differently. Accordingly, it is possible to allow the high pressure gas to pulsate, thereby largely improving the cleaning ability of the high pressure gas.

DETAILED DESCRIPTION OF THE EMBODIMENTS

Hereinafter, an embodiment of the present invention will be described in detail with reference to the accompanying drawings.

Figure 1:
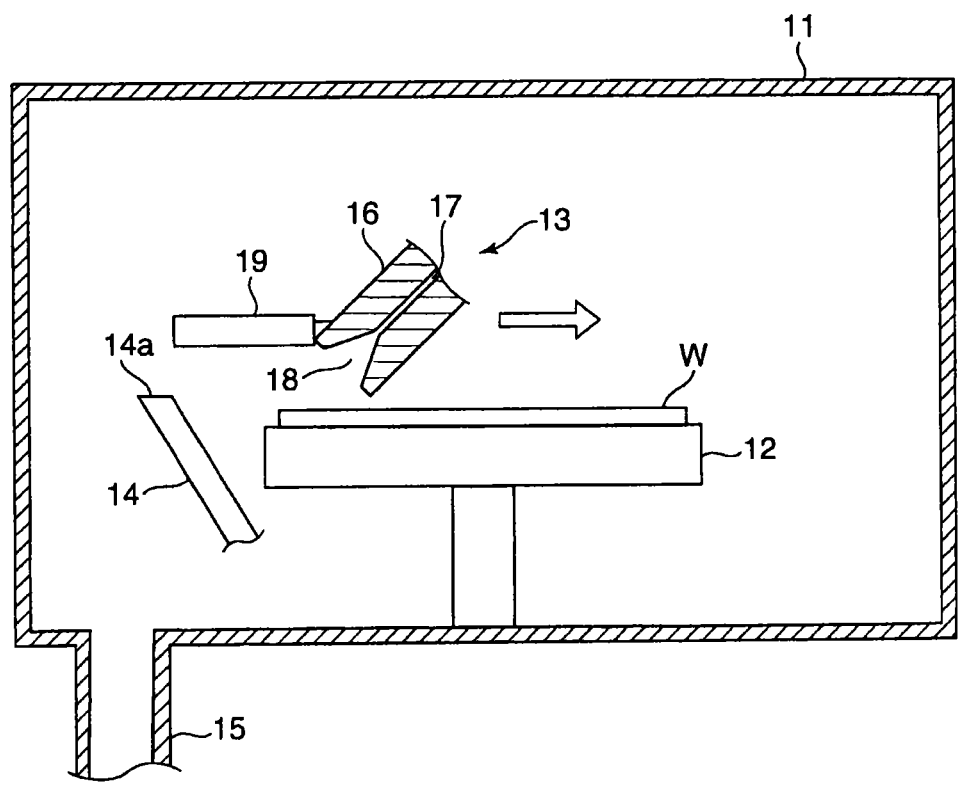
FIG. 1 is a cross-sectional view schematically showing a configuration of a substrate cleaning device for performing a substrate cleaning method according to an embodiment of the present invention.

FIG. 1 is a cross-sectional view schematically showing a configuration of a substrate cleaning device for performing a substrate cleaning method according to an embodiment of the present invention.

In FIG. 1, a substrate cleaning device 10 includes a chamber 11 (processing chamber) whose inner atmosphere is decompressed to nearly a vacuum level, e.g., 1 Pa and which accommodates a semiconductor wafer (hereinafter, simply referred to as "wafer") serving as a substrate, a mounting table 12 which has a table shape and is disposed in the chamber 11 to mount the wafer, a gas spraying nozzle 13 (gas spraying unit) which is disposed in the chamber 11 to face the wafer mounted on the mounting table 12, a cleaning nozzle 14

(ejection unit) which is disposed in the vicinity of the mounting table 12, and an exhaust pipe 15 which exhausts a gas in the chamber 11.

The mounting table 12 includes, e.g., a string-shaped carbon heater (heating unit) (not shown) to heat the wafer W mounted on the mounting table 12 (hereinafter, referred to as "mounted wafer W"). The gas spraying nozzle 13 has a cylindrical base portion 16, a gas ejection hole 17 passing through the base portion 16 in a central axis direction thereof and having a diameter of, e.g., 0.02 mm to 1.0 mm, a gas expansion hole 18 which has been drilled at an end portion of the base portion 16 on the side of the wafer W and has a diameter increasing in a funnel shape toward the end portion, and a plate-shaped particle collection unit 19 which extends substantially parallel to the wafer W in the end portion of the base portion 16 on the side of the wafer W.

The base portion 16 is arranged to be inclined by an angle of, e.g., 45° to the mounted wafer W. The gas ejection hole 17 ejects a gas through the gas expansion hole 18 at a pressure of 0.3 MPa to 2.0 MPa. Accordingly, the gas spraying nozzle 13 sprays a gas to the wafer W at an angle of 45°.

The particle collection unit 19 includes a cooling device, e.g., a peltier element therein, and the peltier element lowers the temperature of the surface of the particle collection unit 19 to be lower than the temperature of the mounted wafer W, e.g., to 10° C.

Further, the gas spraying nozzle 13 can be moved parallel to the surface of the mounted wafer W and the amount of the movement is larger than the diameter of the mounted wafer W. Accordingly, the gas spraying nozzle 13 can spray a gas toward the entire surface of the mounted wafer W. In the gas spraying nozzle 13, the particle collection unit 19 is provided on the left side in the figure so as not to face the mounted wafer W when the gas spraying nozzle 13 is moved to the leftmost position in the figure in a movable range.

The cleaning nozzle 14 is a cylindrical nozzle, which is opened upward in the figure in the chamber 11. An opening 14a of the cleaning nozzle 14 faces the particle collection unit 19 when the gas spraying nozzle 13 moves to the leftmost position in the figure in the movable range.

The exhaust pipe 15 is connected to a dry pump (DP) or turbo-molecular pump (TMP) in the downstream side. The exhaust pipe 15 evacuates the chamber 11 such that the pressure of the atmosphere of the chamber 11 is reduced to nearly a vacuum level, and discharges particles floating in the chamber 11.

FIGS. 2A to 2D are diagrams showing respective steps of the substrate cleaning method being performed by the substrate cleaning device of FIG. 1.

Figure 2A:
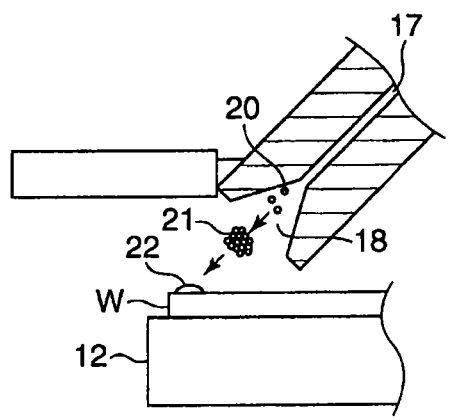
FIGS. 2A to 2D are diagrams showing respective steps of the substrate cleaning method being performed by the substrate cleaning device of FIG. 1.

When removing a foreign material 22 from the mounted wafer W, first, the gas spraying nozzle 13 sprays a cleaning gas (high pressure gas) at a pressure of 0.3 MPa to 2.0 MPa from the gas ejection hole 17 toward the wafer W. At this time, since the atmosphere in the gas expansion hole 18 has nearly a vacuum level in the same manner as the atmosphere in the chamber 11, the pressure of the cleaning gas decreases rapidly, and the diameter of the gas expansion hole 18 increases rapidly along the path of gas molecules 20. Thus, the volume of the cleaning gas increases rapidly. In other words, the cleaning gas sprayed from the gas ejection hole 17 causes a rapid adiabatic expansion so that each of the gas molecules 20 is cooled rapidly. When each of the gas molecules 20 being independently moved one by one initially is cooled rapidly, the kinetic energy is reduced and the gas molecules 20 are in close contact with each other by an intermolecular force (van der Waals force) exerted between the gas molecules 20, thereby forming a cluster 21 including a large number of the gas molecules 20 (FIG. 2A).

Figure 2B:
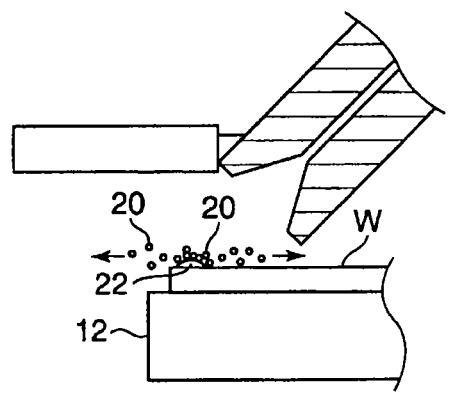

Then, the cluster 21 collides with the foreign material 22 attached to the wafer W as it is without being ionized. At this time, the cluster 21 is decomposed into the gas molecules 20 to scatter after granting the kinetic energy to the foreign material 22 (FIG. 2B).

Here, since the cluster 21 is not ionized, even if a bias voltage is applied to the mounting table 12 to adsorb the wafer W, the cluster 21 is not accelerated by the bias voltage. As a result, the cluster 21 gently collides with the foreign material 22. On the other hand, since the cluster 21 has a large mass even if it is not accelerated, it can grant to the foreign material 22 the energy greater than the energy which one gas molecule 20 grants to the foreign material 22. Therefore, each of the gas molecules 20 scattering from the cluster 21 gently collides with the foreign material 22 or the mounted wafer W without being doped or causing a defect in the mounted wafer W or the film formed on the mounted wafer W. In the foreign material 22 into which the cluster 21 has collided, a chemical reaction between the foreign material 22 and part of the gas molecules 20 is promoted by large kinetic energy that has been granted to the foreign material 22 to thereby generate a reaction product 23. In this case, since a carbon heater embedded in the mounting table 12 heats the reaction product through the wafer W, the chemical reaction between the foreign material 22 and part of the gas molecules 20 is also promoted.

Figure 2C:
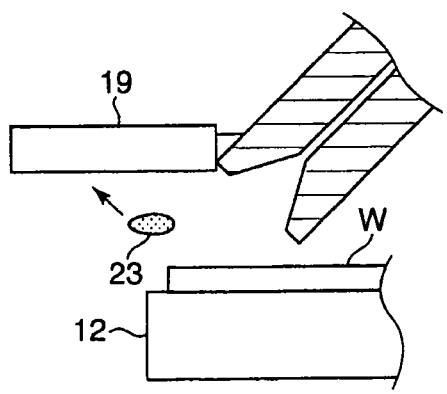
Figure 2D:
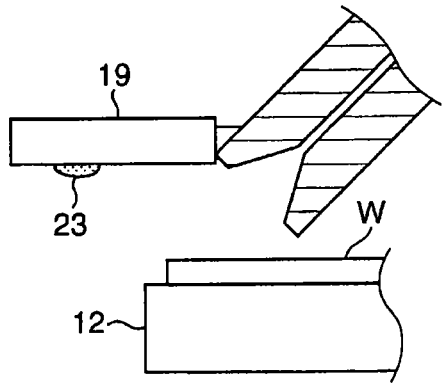

Then, the reaction product 23 continues to receive the kinetic energy by another cluster colliding subsequently and to be heated by the carbon heater embedded in the mounting table 12. Also, the atmosphere around the reaction product 23 has nearly a vacuum level. Thus, the reaction product 23 is easily sublimated and separated from the mounted wafer W to float in the chamber 11. Here, since the surface of the particle collection unit 19 is set to a temperature lower than the temperature of the mounted wafer W by the peltier element included in the particle collection unit 19, the sublimated reaction product 23 is moved toward the particle collection unit 19 by a thermophoretic force to be attached to the particle collection unit 19 (FIG. 2C). In other words, the particle collection unit 19 collects the reaction product 23 separated from the mounted wafer W (FIG. 2D).

The above-described steps of FIGS. 2A to 2D are performed repeatedly while the gas spraying nozzle 13 moves parallel to the surface of the mounted wafer W.

The type of the cleaning gas being sprayed from the gas spraying nozzle 13 is appropriately determined depending on the type of the foreign material 22 attached to the wafer W. For example, if the foreign material 22 is a natural oxide film, e.g., silicon dioxide ($SiO_2$), since chlorine trifluoride ($ClF_3$) causes a chemical reaction with the natural oxide film to generate the reaction product 23, a chlorine trifluoride gas may be used as the cleaning gas. If the foreign material 22 is organic matter, since carbon dioxide ($CO_2$) causes a chemical reaction with the organic matter to generate the reaction product 23, a carbon dioxide gas may be used as the cleaning gas. If the foreign material 22 is metal, since hydrogen halide such as hydrogen fluoride (HF) and hydrogen chloride (HCl) causes a chemical reaction with the metal to generate the reaction product 23, a hydrogen halide gas may be used as the cleaning gas.

Further, since the base portion 16 of the gas spraying nozzle 13 is arranged to be inclined by an angle of, e.g., 45° to the mounted wafer W, the cluster 21 formed from the cleaning gas sprayed from the gas spraying nozzle 13 collides into the mounted wafer W in a direction of 45°. If the cluster 21 collides into the mounted wafer W vertically, a reflection wave that occurs as a reaction of the collision of the cluster 21 is generated perpendicularly to the wafer W. Therefore, since the reflection wave collides head-on with other continuing clusters, the other clusters are decomposed. On the other hand, in the substrate cleaning method of FIGS. 2A to 2D, since the cluster 21 collides with the mounted wafer W in the direction of 45°, a reflection wave occurring as a reaction of the collision of the cluster is generated in a direction of 135°. Thus, the reflection wave does not collide head-on with other continuing clusters, and the other clusters are not decomposed.

When the substrate cleaning method of FIGS. 2A to 2D is continuously performed, the amount of the reaction product 23 attached to the particle collection unit 19 increases and most of the surface of the particle collection unit 19 is covered with the reaction product 23. Accordingly, the reaction product 23 occurring subsequently cannot be attached to the particle collection unit 19 and may continuously float in the chamber 11.

Figure 3A:
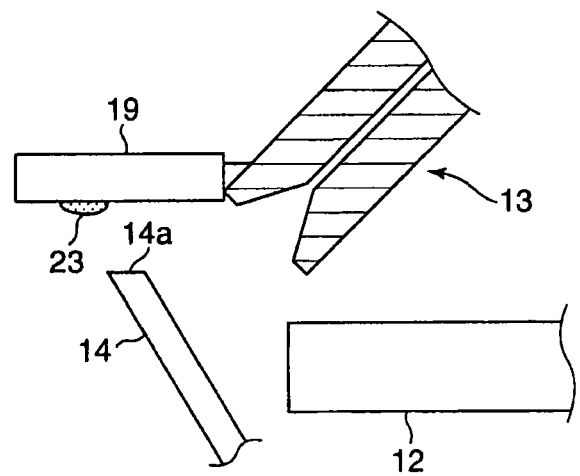
FIGS. 3A and 3B are diagrams showing respective steps of the cleaning method of a particle collection unit in FIG. 1.

In this embodiment, in response to this situation, the particle collection unit 19 is washed regularly. Specifically, after washing a predetermined number of wafers W, in a state where there is no wafer W in the chamber 11, the gas spraying nozzle 13 is moved to the leftmost position in the figure in the movable range, and the particle collection unit 19 is made to face the opening 14a of the cleaning nozzle 14 (FIG. 3A).

Figure 3B:
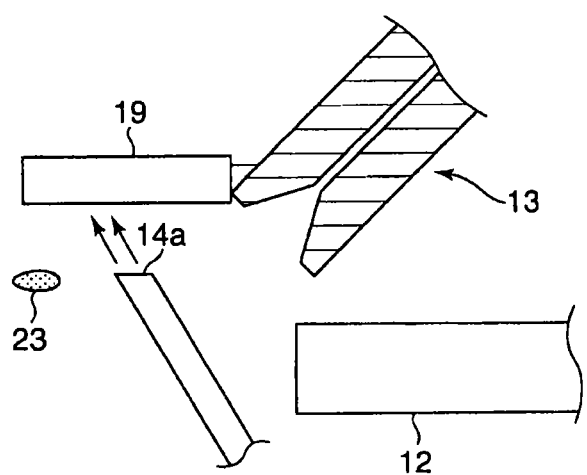
Figure 4A:
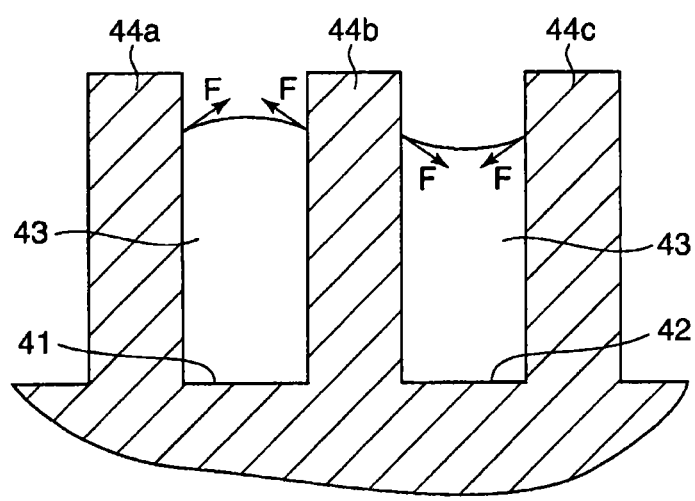
FIGS. 4A and 4B are diagrams showing respective steps of a conventional wafer cleaning method.
Figure 4B:
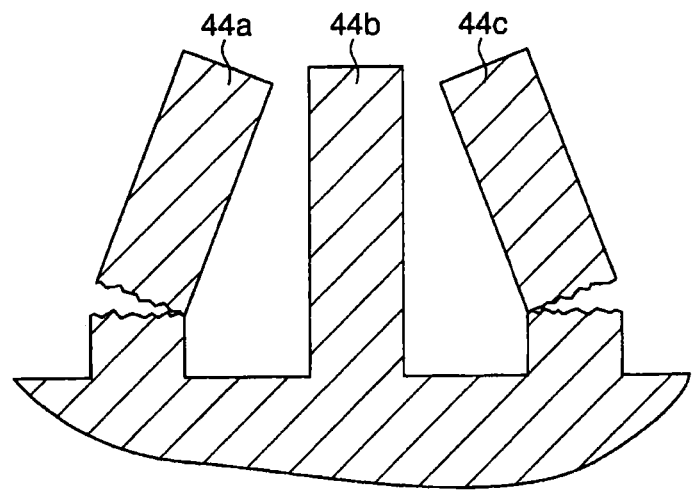

Then, for example, $CO_2$ blast or a cluster of gas molecules is ejected toward the particle collection unit 19 from the opening 14a of the cleaning nozzle 14. The reaction product 23 attached to the particle collection unit 19 is detached from the particle collection unit 19 by the ejected $CO_2$ blast or a cluster of gas molecules (FIG. 3B). The detached reaction product 23 is discharged from the chamber 11 via the exhaust pipe 15. Accordingly, it is possible to prevent most of the surface of the particle collection unit 19 from being covered with the reaction product 23, thereby preventing a reduction in efficiency of collection of the reaction product 23 by the particle collection unit 19.

In the substrate cleaning method in accordance with the embodiment of the present invention, the cluster 21 including the gas molecules 20 without being ionized collides with the mounted wafer W to which the foreign material 22 is attached. Since the non-ionized cluster 21 is never accelerated by a bias voltage or the like, each of the gas molecules 20 scattering after the decomposition of the cluster 21 is not doped or does not cause a defect in the mounted wafer W or the film formed on the mounted wafer W. On the other hand, since the cluster 21 has a large mass even if it is not accelerated, it can grant to the foreign material 22 the kinetic energy greater than the kinetic energy which one gas molecule 20 grants to the foreign material 22 at the time of collision, thereby promoting a chemical reaction between the foreign material 22 and part of the gas molecules 20. Therefore, it is possible to remove the foreign material 22 attached to the mounted wafer W while preventing deterioration of the mounted wafer W or the film formed on the mounted wafer W.

In the substrate cleaning method in accordance with the above-described embodiment, the reaction product 23 removed from the mounted wafer W is attracted and captured to the particle collection unit 19 placed in a location different from the mounted wafer W. Thus, it is possible to prevent the reaction product 23 removed from the mounted wafer W from reaching the mounted wafer W again and being attached to the mounted wafer W again.

In the substrate cleaning method in accordance with the above-described embodiment, since the cleaning gas is sprayed to the mounted wafer W in the direction of, e.g., 45°, the reflection wave occurring as a reaction of the collision of the cluster 21 is generated in the direction of 135°. Thus, the reflection wave does not collide head-on with other clusters, and the other clusters are not decomposed. Therefore, it is possible to continue the collision between the cluster 21 and the mounted wafer W and prevent a reduction in efficiency of removing the foreign material 22 from the mounted wafer W.

Further, in the substrate cleaning method in accordance with the above-described embodiment, since the pressure when the cleaning gas is sprayed ranges from 0.3 MPa to 2.0 MPa, the pressure of the cleaning gas can be reduced rapidly when the gas is sprayed. Further, since the cleaning gas is sprayed from the gas ejection hole 17 having a diameter of 0.02 mm to 1.0 mm, it is possible to increase an expansion rate of the gas when it is sprayed. Accordingly, it causes a rapid adiabatic expansion so that the gas molecules 20 can be cooled rapidly. As a result, it is possible to further promote the formation of the cluster 21.

Further, in the substrate cleaning device in accordance with the above-described embodiment, since there is no need to ionize the cluster 21, the substrate cleaning device 10 does not need to include an ionization device such as an ionizer, and it is possible to simplify the structure of the substrate cleaning device 10.

Further, in the substrate cleaning device in accordance with the above-described embodiment, since the gas spraying nozzle 13 moves along the surface of the mounted wafer W while spraying the cleaning gas, it is possible to remove the foreign material 22 from the entire surface of the mounted wafer W.

Further, it may be difficult to form the cluster 21 according to the type of the cleaning gas, in this case, since the mass of the cluster 21 is not very large, in order to promote a chemical reaction between the foreign material 22 and part of the gas molecules 20, it is preferable to more strongly heat the foreign material 22 by the carbon heater. On the other hand, if the cleaning gas is easy to form the cluster 21, since the mass of the cluster 21 is larger than necessary and sufficient, even though the foreign material 22 is not heated by the carbon heater, it is possible to promote the chemical reaction between the foreign material 22 and part of the gas molecules 20.

In the substrate cleaning device in accordance with the above-described embodiment, one gas spraying nozzle 13 is arranged so as to spray the gas to the mounted wafer W at an angle of 45°. However, in this case, the cleaning gas may be locally obstructed by a pattern or the like formed on the mounted wafer W such that the collision of the cluster 21 does not occur in some places. Therefore, in response to this situation, a plurality of gas spraying nozzles (e.g., two gas spraying nozzles for spraying the gas to the mounted wafer W in directions of 45° and 85°) may be arranged to spray the gas to the mounted wafer W in multiple directions. Accordingly, it is possible to spray the cleaning gas to the mounted wafer W in the multiple directions. Thus, it is possible to prevent the collision of the cluster 21 from failing to occur in some places by preventing the cleaning gas from being locally obstructed. Further, by spraying the cleaning gas in the multiple directions, it is also possible to increase the frequency of collision between the cluster 21 and the foreign material 22.

In a case where a plurality of gas spraying nozzles are arranged, the diameter of the gas ejection hole of each gas spraying nozzle or the pressure of the cleaning gas to be sprayed may be set differently. Further, the spraying timing of the cleaning gas of each gas spraying nozzle may be set differently. Accordingly, it is possible to allow the cleaning gas to pulsate, thereby significantly improving the cleaning ability of the cleaning gas.

In addition, in the substrate cleaning device in accordance with the above-described embodiment, the gas spraying nozzle 13 is moved along the surface of the mounted wafer W. However, the position of the gas spraying nozzle may be fixed and the mounted wafer W may be rotated or slid in a predetermined direction. Also in this case, it is possible to remove the foreign material 22 from the entire surface of the mounted wafer W.

Further, the substrate being applied to the substrate cleaning method in the above-described embodiment is not limited to a semiconductor wafer, and may be various substrates to be used in a flat panel display (FPD) and the like including a liquid crystal display (LCD), photomask, CD substrate, printed circuit board and the like.

DESCRIPTION OF REFERENCE NUMERALS

W wafer
10 substrate cleaning device
12 mounting table
13 gas spraying nozzle
14 cleaning nozzle
19 particle collection unit
20 gas molecules
21 cluster
22 foreign material
23 reaction product

What is claimed is:

1. A substrate cleaning method comprising:
forming a cluster including gas molecules by spraying, toward a substrate to which a foreign material is attached and which is disposed in a low pressure atmosphere, a high pressure gas having a pressure higher than that of the low pressure atmosphere by using a gas spraying unit which includes a base portion and a cooling unit which extends from an end portion of the base portion;
allowing the cluster to collide with the substrate without being ionized to thereby remove the foreign material from the substrate; and
maintaining a temperature of the cooling unit to be lower than that of the substrate to thereby capture the removed foreign material by the cooling unit.

2. The substrate cleaning method of claim 1, wherein the high pressure gas is obliquely sprayed to the substrate.

3. The substrate cleaning method of claim 1, wherein the foreign material is a natural oxide film, and the gas is a chlorine trifluoride gas.

4. The substrate cleaning method of claim 1, wherein the foreign material is organic matter, and the gas is a carbon dioxide gas.

5. The substrate cleaning method of claim 1, wherein the foreign material is metal, and the gas is a hydrogen halide gas.

6. The substrate cleaning method of claim 1, wherein when the cluster collides with the substrate, the substrate is heated.

7. The substrate cleaning method of claim 1, wherein the pressure when the gas is sprayed ranges from 0.3 MPa to 2.0 MPa.

8. A substrate cleaning device comprising:
a processing chamber configured to accommodate a substrate, to which a foreign material is attached, in a low pressure atmosphere; and
a gas spraying unit configured to spray, toward the substrate, a high pressure gas having a pressure higher than that of the low pressure atmosphere to form a cluster including gas molecules to thereby make the cluster collide with the substrate without being ionized to remove the foreign material from the substrate,
wherein the gas spraying unit includes a base portion and a cooling unit which extends from an end portion of the base portion,
wherein the cooling unit is configured to have a temperature lower than that of the substrate to capture the removed foreign material.

9. The substrate cleaning device of claim 8, wherein the gas spraying unit moves along a surface of the substrate while spraying the high pressure gas.

10. The substrate cleaning device of claim 8, wherein the gas spraying unit obliquely sprays the high pressure gas to the substrate.

11. The substrate cleaning device of claim 8, further comprising a heating unit which heats the substrate.

12. The substrate cleaning device of claim 8, further comprising an ejection unit which is configured to eject $CO_2$ blast or another cluster including gas molecules toward the cooling unit to thereby clean the cooling unit.

13. The substrate cleaning device of claim 8, wherein the gas spraying unit sprays the high pressure gas from a hole having a diameter of 0.02 mm to 1.0 mm.

14. The substrate cleaning method of claim 1, wherein the high pressure gas is sprayed to the substrate in multiple directions.

15. The substrate cleaning method of claim 14, wherein the pressure and/or a spraying timing of the high pressure gas being sprayed in each of the multiple directions are set differently.

16. The substrate cleaning device of claim 8, wherein the gas spraying unit is provided in a plural number to spray the high pressure gas toward the substrate in multiple directions.

17. The substrate cleaning device of claim 16, wherein the pressure of the high pressure gas being sprayed in each of the multiple directions by the gas spraying units is set differently, and/or the gas spraying units spray the high pressure gas at different spraying timings.

18. The substrate cleaning method of claim 1, wherein the cooling unit has a plate shape and extends parallel to the substrate from the end portion of the base portion.

19. The substrate cleaning method of claim 1, wherein said forming the cluster includes ejecting the high pressure gas from a gas ejection hole passing through the base portion.

20. The substrate cleaning method of claim 1, wherein the gas spraying unit moves along a surface of the substrate while spraying the high pressure gas.

21. The substrate cleaning method of claim 1, wherein the method further comprising ejecting $CO_2$ blast or another cluster including gas molecule toward the cooling unit to thereby clean the cooling unit.

22. The substrate cleaning method of claim 21, wherein said ejecting is carried out when the cooling unit is placed not to face the substrate.

23. The substrate cleaning device of claim 8, wherein the cooling unit has a plate shape and extends parallel to the substrate from the end portion of the base portion.

24. The substrate cleaning device of claim 12, wherein the ejection unit has an opening through which the $CO_2$ blast or the another cluster is ejected and the opening faces the cooling unit when the cooling unit is placed not to face the substrate.

* * * * *